(12) United States Patent
Kimura et al.

(10) Patent No.: US 9,106,047 B2
(45) Date of Patent: Aug. 11, 2015

(54) OPTICAL SEMICONDUCTOR ELEMENT PACKAGE AND OPTICAL SEMICONDUCTOR DEVICE

(75) Inventors: Yasuyuki Kimura, Nagano (JP); Mikio Suyama, Nagano (JP); Misuzu Machii, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 136 days.

(21) Appl. No.: 13/459,535

(22) Filed: Apr. 30, 2012

(65) Prior Publication Data
US 2012/0287955 A1    Nov. 15, 2012

(30) Foreign Application Priority Data

May 10, 2011    (JP) ................................. 2011-105100

(51) Int. Cl.
| | | |
|---|---|---|
| H01S 3/00 | (2006.01) | |
| H01S 5/022 | (2006.01) | |
| H01L 23/053 | (2006.01) | |
| H01L 23/055 | (2006.01) | |
| H01L 23/495 | (2006.01) | |
| H01S 5/062 | (2006.01) | |
| H01S 5/0683 | (2006.01) | |

(52) U.S. Cl.
CPC ......... *H01S 5/02276* (2013.01); *H01S 5/02212* (2013.01); *H01L 23/053* (2013.01); *H01L 23/055* (2013.01); *H01L 23/49506* (2013.01); *H01L 2224/45144* (2013.01); *H01L 2224/48091* (2013.01); *H01S 5/02248* (2013.01); *H01S 5/02284* (2013.01); *H01S 5/0683* (2013.01); *H01S 5/06226* (2013.01)

(58) Field of Classification Search
CPC ............ H01S 5/02212; H01S 5/02244; H01L 23/053; H01L 23/055; H01L 23/49506
USPC ........... 372/43.01, 34, 36; 361/717, 723, 813; 257/693, 703, 80–82
See application file for complete search history.

(56) References Cited

U.S. PATENT DOCUMENTS

| | | | |
|---|---|---|---|
| 4,953,171 A | 8/1990 | Nakajima | |
| 6,659,659 B1 * | 12/2003 | Malone | ........................... 385/94 |

(Continued)

FOREIGN PATENT DOCUMENTS

| | | |
|---|---|---|
| JP | 01-305587 A | 12/1989 |
| JP | 2003-163382 A1 | 6/2003 |

(Continued)

OTHER PUBLICATIONS

Japanese Office Action issued Jul. 22, 2014 in counterpart application No. 2011-105100 with English translation.

*Primary Examiner* — Tod T Van Roy
(74) *Attorney, Agent, or Firm* — Kratz, Quintos & Hanson, LLP

(57) ABSTRACT

An optical semiconductor element package, includes a ceramic wiring substrate portion having a mounting area for mounting an optical semiconductor element in a center part, and including an element electrode for connecting the optical semiconductor element, and an external connection electrode connected to the element electrode, and a metal sealing ring provided on the ceramic wiring substrate portion, and including an opening portion exposing the element electrode and the mounting area, in a center part, and a ring-like protruding portion provided to an outer peripheral part of the opening portion.

10 Claims, 7 Drawing Sheets

(56) References Cited

U.S. PATENT DOCUMENTS

| | | | |
|---|---|---|---|
| 7,223,629 B2 * | 5/2007 | Zheng et al. | 438/106 |
| 2003/0138008 A1 | 7/2003 | Riaziat | |
| 2003/0138024 A1 * | 7/2003 | Williamson et al. | 372/108 |
| 2005/0201433 A1 | 9/2005 | Riaziat | |
| 2007/0023414 A1 * | 2/2007 | Scharf et al. | 219/445.1 |
| 2011/0317965 A1 | 12/2011 | Fujimura et al. | |

FOREIGN PATENT DOCUMENTS

| | | |
|---|---|---|
| JP | 2005-516404 A1 | 6/2005 |
| JP | 2010-186965 A1 | 8/2010 |
| WO | 2010/131767 A2 | 11/2010 |

\* cited by examiner

OPTICAL SEMICONDUCTOR ELEMENT PACKAGE AND OPTICAL SEMICONDUCTOR DEVICE

CROSS-REFERENCE TO RELATED APPLICATIONS

This application is based upon and claims the benefit of priority of the prior Japanese Patent Application No. 2011-105100, filed on May 10, 2011; the entire contents of which are incorporated herein by reference.

FIELD

It is related to an optical semiconductor element package and an optical semiconductor device.

BACKGROUND

In the prior art, there is an optical semiconductor element package on which a light emitting element or a light receiving element, and the like is mounted. In the optical semiconductor element package in the prior art, leads that are sealed in a circular header with glass are provided. Also, a light emitting element and a light receiving element for monitoring lights from the light emitting element are mounted on the header, then a cap in which a transparent glass window is provided in its center part is mounted on the header, and then the light emitting element and the light receiving element are hermetically sealed.

In Japanese Laid-open Patent Publication No. 2010-186965, Japanese Laid-open Patent Publication No. 2003-163382, and Japanese National Publication of International Patent Application No. 2005-516404, the related arts are disclosed.

As explained in the column of the preliminary matter described later, in the optical semiconductor element package in which the leads are sealed in the circular header with the glass, even though there is a request that the leads should be placed closer to the surface emitting laser in order to reduce a transmission loss of the transmission path, it cannot easily respond to such request.

SUMMARY

According to one aspect discussed herein, there is provided an optical semiconductor element package, which includes a ceramic wiring substrate portion having a mounting area for mounting an optical semiconductor element in a center part, and including an element electrode for connecting the optical semiconductor element, and an external connection electrode connected to the element electrode, and a metal sealing ring provided on the ceramic wiring substrate portion, and including an opening portion exposing the element, electrode and the mounting area, in a center part, and a ring-like protruding portion provided to an outer peripheral part of the opening portion.

Also, according to another aspect discussed herein, there is provided an optical semiconductor device, which includes the optical semiconductor element package set forth in any one of claims 1 to 5, the optical semiconductor element mounted in the mounting area, a metal wire connecting an electrode of the optical semiconductor element and the element electrode, and a metal cap provided on the metal sealing ring, and having a glass window in a center part to hermetically seal the optical semiconductor element.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENTS

An embodiment will be explained with reference to the accompanying drawings hereinafter.

Prior to the explanation of the present embodiment, the preliminary matter to be set forth as a basis will be explained hereunder.

Figure 1:
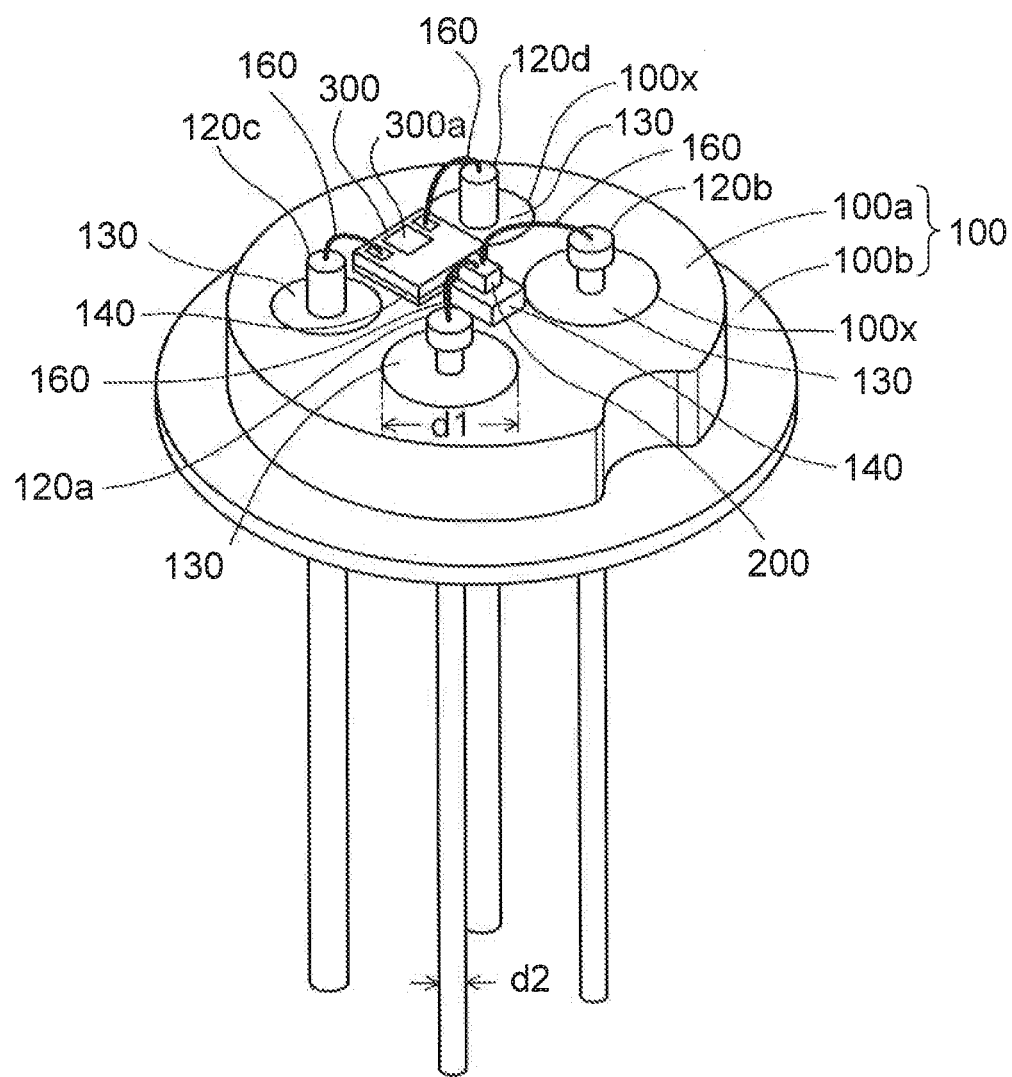
FIG. 1 is a perspective views depicting a state that a surface emitting laser and a photodiode are mounted on an optical semiconductor element package according to the preliminary matter.

As depicted in FIG. 1, an optical semiconductor element package according to the preliminary matter includes a header 100 made of a metal having a disc-shaped main body portion 100a, and a ring-like edge portion 100b provided to a lower part of the periphery of the main body portion 100a.

Then, glass to metal sealing holes 100x each penetrating the header in the thickness direction are provided in the header 100. First to fourth leads 120a, 120b, 120c, 120d are passed through the glass to metal sealing holes 100x in the header 100 and are fixed thereto respectively in a state that these leads 120a to 120d are sealed with a glass portion 130.

A surface emitting laser 200 is mounted on the header 100 in an area between the first lead 120a and the second lead 120b via a submount 140 in a state that its light emitting portion is directed upward. Then, electrodes of the surface emitting laser 200 are connected to the first and second leads 120a, 120b via a gold wire 160 respectively.

Also, a photodiode 300 is mounted on the header 100 in an area between the third lead 120c and the fourth lead 120d via the submount 140 in a state that its light receiving portion 300a is directed upward. Then, electrodes of the photodiode 300 are connected to the third and fourth leads 120c, 120d via the gold wire 160 respectively.

Figure 2:
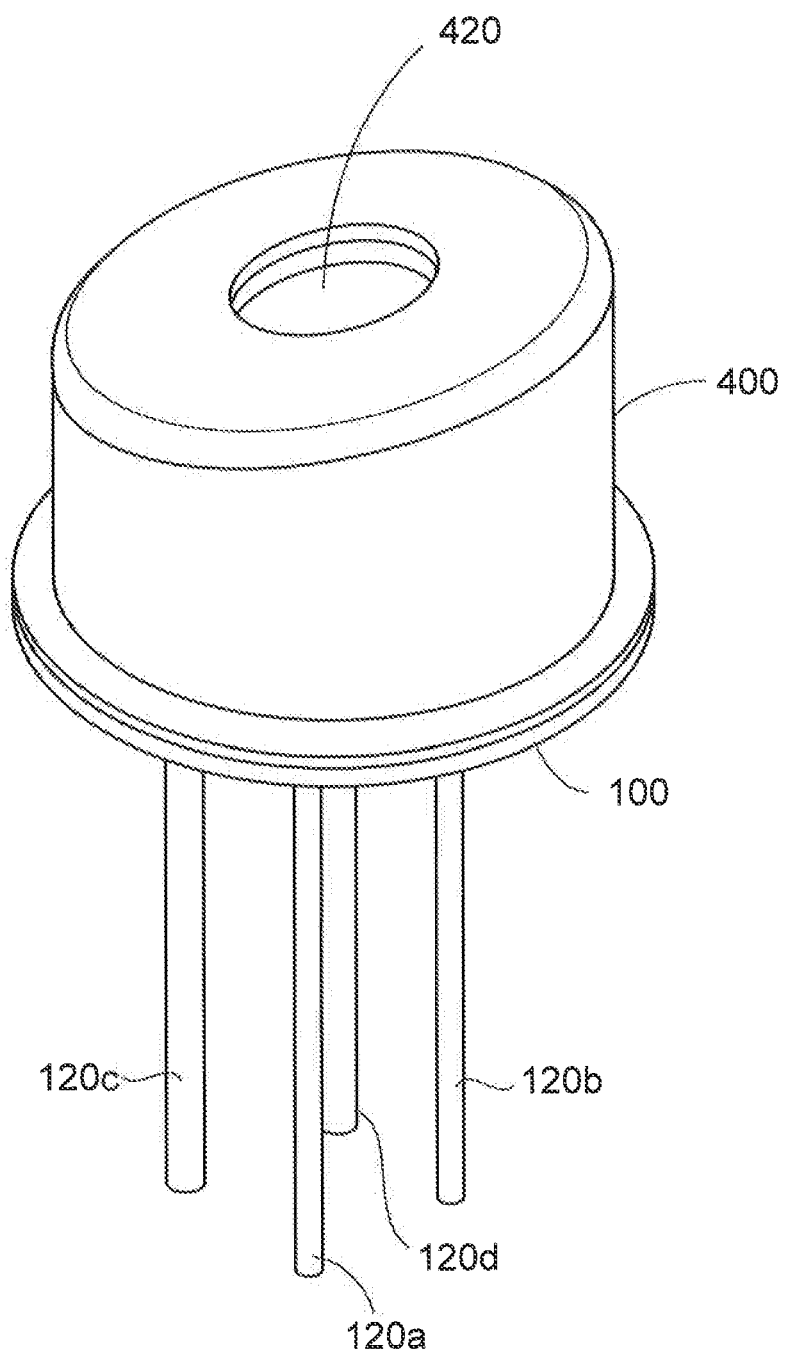
FIG. 2 is a perspective view depicting such a state that a metal cap is mounted on the optical semiconductor element package in FIG. 1.

Then, as depicted in FIG. 2, a metal cap 400 in a center part of which a transparent glass window 420 is provided is fitted on the header 100 in FIG. 1. Thereby, the surface emitting laser 200 and the photodiode 300 are hermetically sealed in the metal cap 400. The glass window 420 of the metal can 400 is formed to incline with respect to the horizontal direction.

The light emitted from the surface emitting laser 200 is transmitted through the glass window 420 of the metal cap 400, and is transferred to an optical fiber on the outside. At this time, a part of the light emitted from the surface emitting laser 200 is reflected by the inclined glass window 420, and then is entered into the light receiving portion 300a of the photodiode 300. In this way, the light being emitted from the surface emitting laser 200 is monitored by the photodiode 300.

In the optical semiconductor element package, the characteristic impedances of the transmission paths must be matched mutually in order to transfer the high-speed signal. Commonly, the characteristic impedance of the transmission path is set to 50Ω.

In order to set the impedance to such characteristic impedance, it is common in the example in FIG. 1 that, although depending on a dielectric constant of the used glass, a diameter d1 of the glass to metal sealing holes 100x (a diameter of the glass portions 130) formed in the header 100 is set to about 1.3 mm, and a diameter d2 of the first and second leads 120a, 120b placed in the center of the glass portions 130 respectively is set to 0.2 mm.

Therefore, considering a margin for layout of respective components, the surface emitting laser 200 and each of the leads 120a, 120b should be positioned at a distance of at least about 1 mm respectively. Also, the surface emitting laser 200 and each of the leads 120a, 120b are connected via the gold wire 160 made of a thin line whose wire diameter is about 25 μm. It is difficult to bond the wires to such thin leads.

In this way, it is necessary to separately arrange the surface emitting laser 200 and each of the leads 120a, 120b to some extent. Therefore, lengths of the gold wires 160 become long, and thus a transmission loss of the transmission path is increased. As the measure against this problem, such an approach may be considered that the surface emitting laser 200 and each of the leads 120a, 120b are connected with a plurality of gold wires 160 to reduce the electric resistances of the wire and thus a transmission loss of the transmission path is reduced. However, actually it is difficult to apply such approach since areas of the electrodes of the surface emitting laser 200 are not enough or production efficiency is worsened.

Also, as for making process of the header, when the above sealing glass portions 130 are burnt, the header 100 is set in the jig made of carbon, and then the burning process is applied at a temperature of about 1000° C. When difference between thermal expansion coefficients of respective materials and the consumption of the jig are considered, it is extremely difficult to reduce the area of the glass portion 130 more than the above design rule, and seal the first and second leads 120a, 120b in the center part of the glass portions 130 with high precision.

From such viewpoint, it is hard to place the surface emitting laser 200 and the first and second leads 120a, 120b closer mutually than the above arrangement.

In this manner, in the optical semiconductor element package according to the preliminary matter, even though there is a request that the surface emitting laser 200 and the first and second leads 120a, 120b should be placed closer mutually in order to reduce further a transmission loss of the transmission path, it cannot easily respond to this request.

Moreover, a diameter of the first and second leads 120a, 120b is considerably thin such as 0.2 mm or so. Therefore, upon sealing the lead with the glass or upon coupling the optical semiconductor device to the optical fiber, careful attention is necessary in handling the lead and thus lowering of productivity is caused.

According to an optical semiconductor element package according to an embodiment described hereunder, the disadvantages mentioned above can be solved.

(Embodiment)

Figure 3:
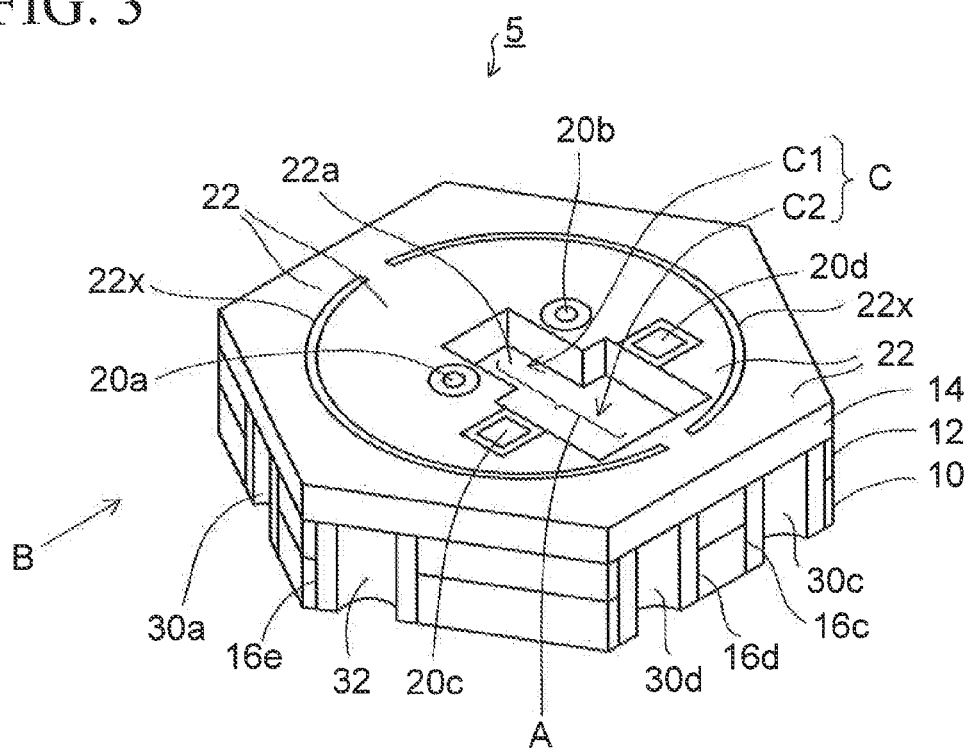
FIG. 3 is a perspective view depicting a ceramic wiring substrate portion of an optical semiconductor element package according to an embodiment.
Figure 4:
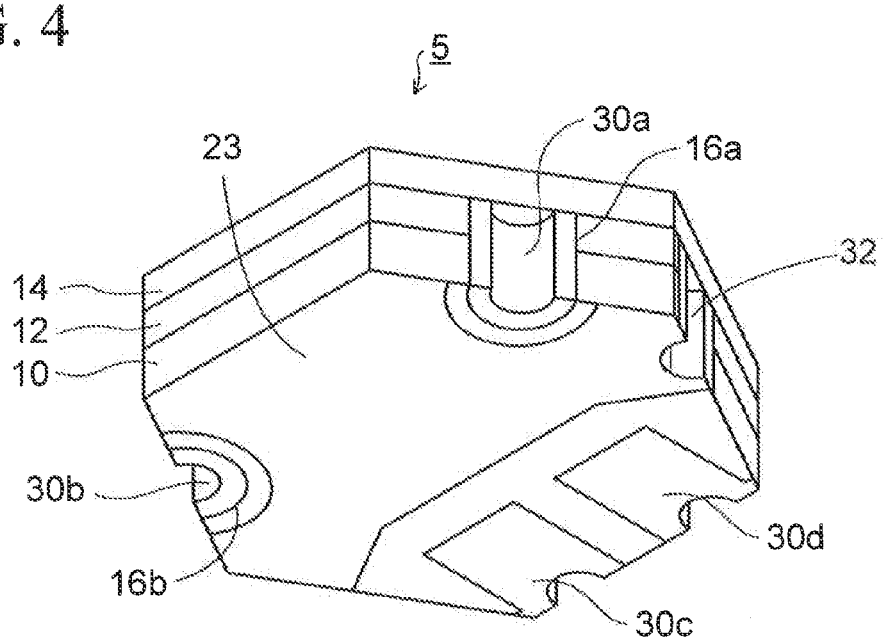
FIG. 4 is a perspective view depicting a state of the ceramic wiring substrate portion on the lower surface side when viewed from the B direction in FIG. 3.
Figure 5A:
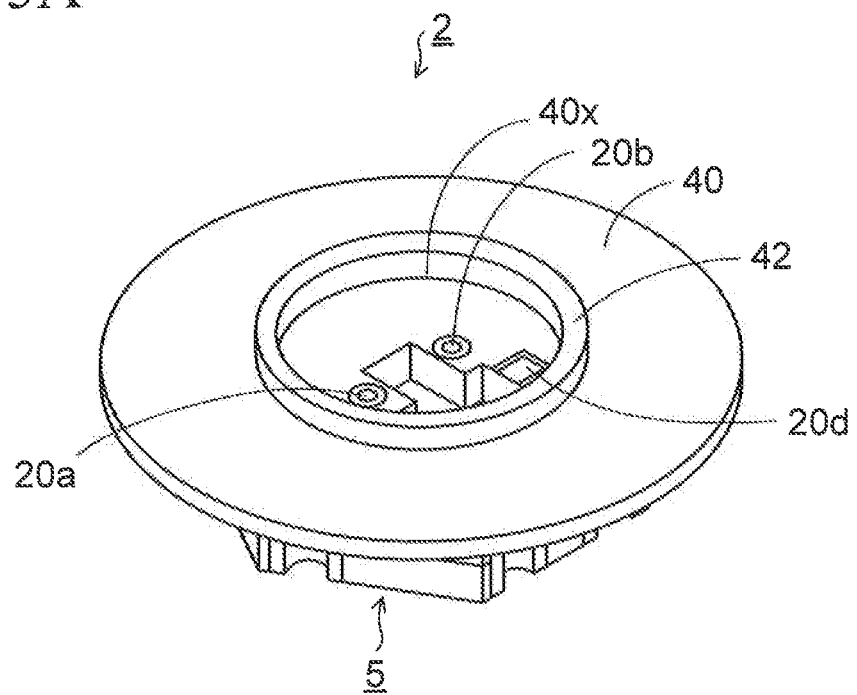
FIG. 5A is a perspective view depicting the optical semiconductor element package according to the embodiment.
Figure 5B:
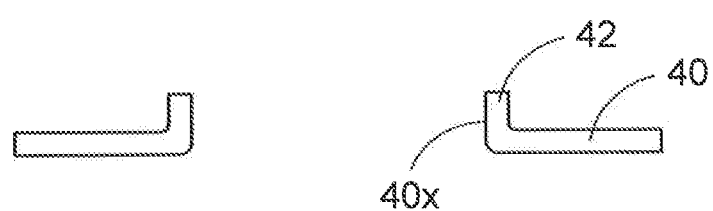
FIG. 5B is a sectional view depicting a metal sealing ring of the optical semiconductor element package in FIG. 5A.
Figure 6A:
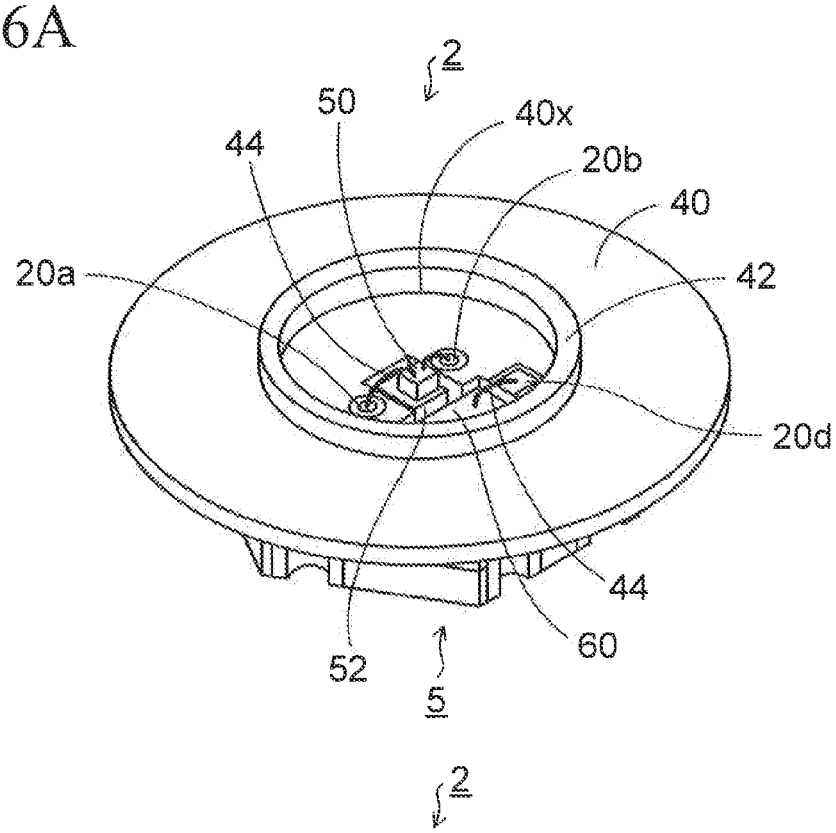
FIGS. 6A and 6B are a perspective view and a sectional view depicting a state that a surface emitting laser and a light receiving element are mounted on the optical semiconductor element package in FIG. 5.
Figure 6B:
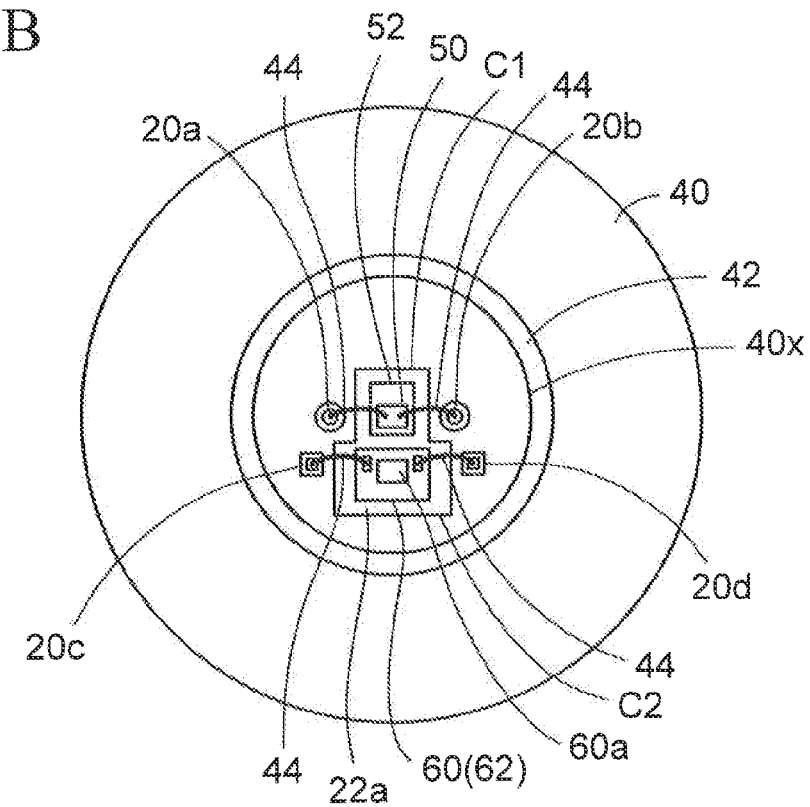
Figure 7:
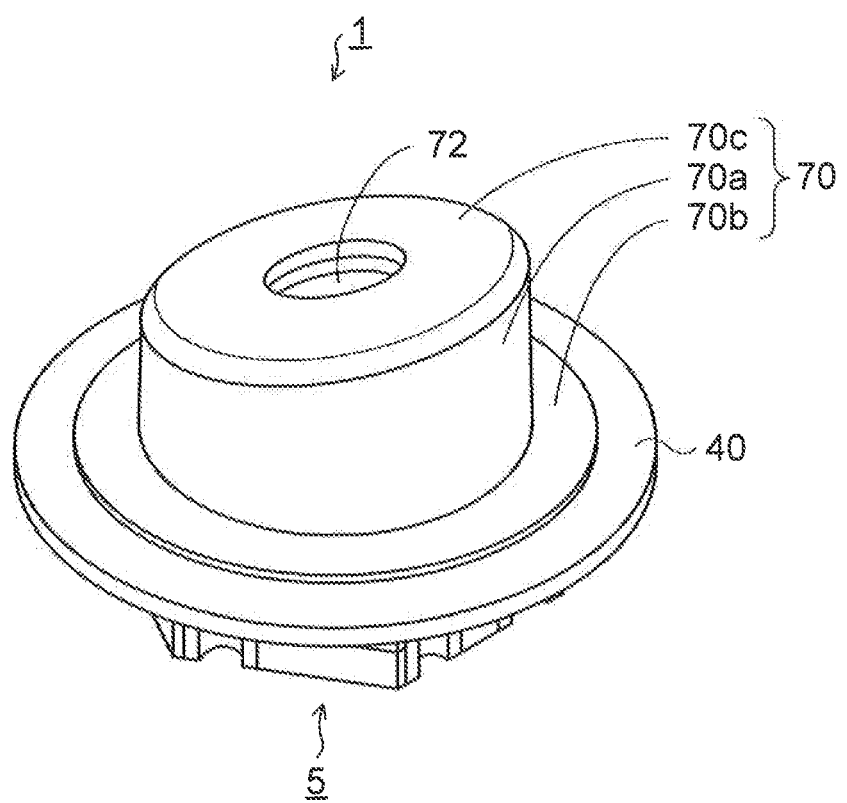
FIG. 7 is a perspective view depicting an optical semiconductor device according to the embodiment.

FIG. 3 and FIG. 4 are perspective views depicting a ceramic wiring substrate portion of an optical semiconductor element package according to an embodiment respectively, FIG. 5A and FIG. 5B are views depicting the optical semiconductor element package according to the embodiment. FIGS. 6A and 6B are views depicting a state that optical semiconductor elements are mounted on the optical semiconductor element package according to the embodiment, and FIG. 7 is a perspective view depicting an optical semiconductor device according to the embodiment.

As depicted in FIG. 3, an optical semiconductor element package of the embodiment has a ceramic wiring substrate portion 5. The ceramic wiring substrate portion 5 has a hexagonal shape as an outer shape when viewed from the top. This ceramic wiring substrate portion 5 is formed by stacking a second ceramic wiring substrate portion 12 and a third ceramic wiring substrate portion 14 on a first ceramic wiring substrate portion 10. As the preferred example of the outer shape of the ceramic wiring substrate portion 5 the hexagonal shape is illustrated. But either a polygonal shape such as an octagonal shape, or the like, or a circular shape may be employed.

In FIG. 3, in order to make an explanation easy to understand, the explanation is done in a state that the ceramic wiring substrate portion 5 is divided into the first to third ceramic wiring substrate portions 10, 12, 14. Actually the ceramic wiring substrate portion 5 is formed of an integral ceramic body.

As described later, an optical semiconductor element package is built up by providing a metal sealing ring on the ceramic wiring substrate portion 5. Then, a light emitting element and a light receiving element are mounted on the optical semiconductor element package and then a metal cap having a glass window is mounted thereon, thereby an optical semiconductor device is obtained.

Because the optical semiconductor device is coupled to a optical fiber device having circular shape, the metal cap, etc. are formed as a circular member. For this reason, the ceramic wiring substrate portion 5 of the optical semiconductor element package is set to the shape that is close to a circular shape, such as a hexagonal shape, an octagonal shape, or the like, so as to match the circular members such as the cap, or the like.

That is, in the case that the ceramic wiring substrate portion 5 is formed as a quadrangular shape, their corner parts are exposed from the circular member such as the metal cap, or the like. Therefore, it becomes difficult to get the matching between the outer shapes of these members, and thus the use of such quadrangular shape is undesirable. However, if no problem particularly arises, it is possible to form the ceramic wiring substrate portion 5 as a quadrangular shape.

The ceramic wring substrate portion 5 is manufactured based on the green sheet method. To explain in detail, first, the green sheet which is obtained by shaping ceramic powders such as alumina, or the like, into a sheet shape by the binding agent, or the like is prepared, and then the required wiring layer is formed by a conductive paste made of tungsten, copper, or the like, on the green sheet and also the conductive paste is filled into through holes.

Then, a plurality of sheets (in the present embodiment, three sheets) of green sheets are laminated, pressed, and burned, then the resultant sheet is cut by the dicing saw. Thus, the ceramic wiring substrate portion 5 is obtained. The number of laminated layers of the green sheet can be set arbitrarily, so that the ceramic wiring substrate portion having various layered structures can be manufactured.

When the burned ceramic sheet is cut, it is relatively difficult to cut such burned ceramic sheet into a circular shape. Therefore, such burned ceramic sheet is cut into a hexagonal shape or an octagonal shape, which is close to a circular shape and is easy to process.

In the ceramic wiring substrate portion 5 according to the embodiment, a cavity C (concave portion) which penetrates in the thickness direction is provided in the center part of the uppermost third ceramic wiring substrate portion 14. The cavity C (concave portion) has a first cavity C1 which is provided in the center part and in which the surface emitting laser is arranged, and a second cavity C2 which is formed adjacent to one end of the first cavity C1 and in which the light receiving element is arranged.

A width of the second cavity C2 is set wider than a width of the first cavity C1. A depth of the cavity C can be set to any depth.

In this manner, the cavity C is provided in the center part of the ceramic wiring substrate portion 5, and a bottom part of the cavity C constitutes a mounting area A.

A first element electrode 20a it a second element electrode 20b, both shaped into a circular cylinder, are formed in the third ceramic wiring substrate portion 14 locate to both vicinity sides of the first cavity C1, from its upper surface to the thickness direction. The first element electrode 20a and the second element electrode 20b are the electrodes to which the light emitting element (the optical semiconductor element) is connected.

In the example in FIG. 3, the first element electrode 20a and the second element electrode 20b are formed as the penetration electrode, which penetrates the third ceramic wiring substrate portion 14 in the thickness direction, respectively.

FIG. 4 is a perspective view depicting the ceramic wiring substrate portion 5 when the lower surface side in FIG. 3 is viewed from the B direction. By reference to FIG. 3 and FIG. 4 together, the first element electrode 20a is connected to a first external connection electrode 30a, which is formed on sidewalls of the first and second ceramic wiring substrate portions 10, 12, via a wiring layer (not shown) which is formed on the second ceramic wiring substrate portion 12.

A concave portion 16a (FIG. 4) shaped like a half circular column is provided from lower ends of the sidewalls of the first and second ceramic wiring substrate portions 10, 12 toward the upper sides. Also, the first external connection electrode 30a shaped like a half cylinder is formed on an inner surface of the concave portion 16a.

Also, by reference to FIG. 3 and FIG. 4 together, the second element electrode 20b is connected to a second external connection electrode 30b, which is formed on sidewalls of the first and second ceramic wiring substrate portions 10, 12, via a wiring layer (not shown) which is formed on the second ceramic wiring substrate portion 12.

A concave portion 16b (FIG. 4) is provided from lower ends on the sidewalls of the first and second ceramic wiring substrate portions 10, 12 toward the upper sides. Also, the second external connection electrode 30b shaped like a half cylinder is formed on an inner surface of the concave portion 16b.

In this manner, the first and second element electrodes 20a, 20b are connected to the first and second external connection electrodes 30a, 30b via the wiring layers, which are formed in the inner parts of the ceramic wiring substrate portion 5 respectively.

The ceramic wiring substrate portion 5 according to the present embodiment is manufactured based on the green sheet method. Therefore, respective distances between the light emitting element to be mounted and the first and second element electrodes 20a, 20b can be made shorter than those of the header 100 described above in the preliminary matter.

That is, in the ceramic wiring substrate portion 5, respective distances between the electrodes of the light emitting element and the first and second element electrodes 20a, 20b can be decreased close to about 0.5 mm, and such distances can be set less than half of those in the header 100 described above in the preliminary matter. As described above, in the header 100 in the preliminary matter, the distance of about 1 mm is needed between the electrodes of the surface emitting laser 200 and the first and second leads 120a, 120b respectively.

Accordingly, lengths of the gold wires used to connect the light emitting element to be mounted and the first and second element electrodes 20a, 20b can be shortened respectively. Therefore, a transmission loss of the transmission bath can be decreased rather than that of the header 100 described in the preliminary matter, and this ceramic wiring substrate portion 5 can respond to the higher-speed transmission of the electric signals. As a result, this ceramic wiring substrate portion 5 can respond to the application of the large capacity optical communication of 10 Gbps or more.

Also, as depicted in FIG. 3, a third element electrode 20c and a forth element electrode 20d, both shaped like a quadrangular post, are formed in the parts of the third ceramic wiring substrate portion 14 located to both vicinity of the second cavity C2, from its upper surface to the thickness direction, respectively. The third element electrode 20c and the forth element electrode 20d are the electrodes to which the light receiving element (the optical semiconductor element) is connected.

In the example in FIG. 3, like the first and second element electrodes 20a, 20b, the third element electrode 20c and the forth element electrode 20d are formed as the penetration electrode, which penetrates the third ceramic wiring substrate portion 14 in the thickness direction, respectively.

Also, by reference to FIG. 3 and FIG. 4 together, the third element electrode 20c is connected to a third external connection electrode 30c (FIG. 4), which is formed to extend from the sidewalls of the first and second ceramic wiring substrate portions 10, 12 to the lower surface of the first ceramic wiring substrate portion 10, via a wiring layer (not shown) formed on the second ceramic wiring substrate portion 12.

A concave portion 16c (FIG. 3) shaped like the half circular column is provided on sidewalls of the first and second ceramic wiring substrate portions 10, 12 from the lower ends to the upper sides. Also, the third external connection electrode 30c shaped like a half cylinder is formed on the inner surface of the concave portion 16c.

Also, by reference to FIG. 3 and FIG. 4 together, the forth element electrode 20d is connected to a fourth external connection electrode 30d (FIG. 4), which is formed to extend from the sidewalls of the first and second ceramic wiring substrate portions 10, 12 to the lower surface of the first ceramic wiring substrate portion 10, via a wiring layer (not shown) formed on the second ceramic wiring substrate portion 12.

A concave portion 16d (FIG. 3) shaped like the half circular column is provided on sidewalls of the first and second ceramic wiring substrate portions 10, 12 from the lower ends to the upper sides. Also, the fourth external connection electrode 30d shaped like the half cylinder is formed on the inner surface of the concave portion 16d.

The third and fourth external connection electrodes 30c, 30d are arranged side by side on the identical sidewalls, which is one sidewall of the first and second ceramic wiring substrate portions 10, 12 having the hexagonal shape.

Also, as depicted in FIG. 3, an upper ground plane 22 is formed integrally on the third ceramic wiring substrate portion 14 in a state that this upper ground plane 22 is separated from the first to forth element electrodes 20a to 20d. Then, an opening portion 22x shaped like a half circle is formed on the upper ground plane 22 in both outer areas of the cavity C respectively.

Also, an upper ground plane 22a is formed on the area of the second ceramic wiring substrate portion 12 located on the bottom part of the cavity C.

Then, by reference to FIG. 3 and FIG. 4 together, the upper ground plane 22 formed on the third ceramic wiring substrate portion 14 is connected to the penetration electrode (not shown) provided to penetrate the third ceramic wiring substrate portion 14.

Further, the penetration electrode (not shown) connected to the upper ground plane 22 is connected to a ground connection electrode 32, which is formed on the sidewalls of the first and second ceramic wiring substrate portions 10, 12, via the wiring layer (not shown) formed on the second ceramic wiring substrate portion 12.

A concave portion 16e (FIG. 3) shaped similarly like the half circular column is provided on sidewalls of the first and second ceramic wiring substrate portions 10, 12 from the lower ends toward the upper sides. Also, the ground connection electrode 32 shaped like the half cylinder is formed on the inner surface of the concave portion 16e.

Also, the upper ground plane 22a formed on the second ceramic wiring substrate portion 12 in the cavity C is connected to the ground connection electrode 32 via a wiring layer (not shown) formed on the second ceramic wiring substrate portion 12.

Then, as depicted in FIG. 4, a lower ground plane 23 connected to the ground connection electrode 32 is formed integrally on the lower surface of the first ceramic wiring substrate portion 10.

As described above, the ceramic wiring substrate portion 5 according to the present embodiment has the mounting area A on the center part of which the optical semiconductor element is mounted, and the first to fourth element electrodes 20a to 20d for connecting the optical semiconductor element and the first to fourth external connection electrodes 30a to 30d connected correspondingly to these element electrodes. Also, the light emitting element is mounted on the bottom part of the first cavity C1, and the light receiving element is mounted or the bottom part of the second cavity C2.

Also, the wiring layers (not shown) are arranged between the upper ground plane 22 and the lower ground plane 23 via alumina ceramics (dielectrics), and thus the strip lines are formed. In this way, the characteristic impedance of the transmission paths that are extended from the first and second element electrodes 20a, 20b, to which the light emitting element is connected, to the first and second external connection electrodes 30a, 30b via the wiring layers (not shown), is set to 50Ω. Accordingly, this transmission paths can function as the path to transfer a high-speed signal.

In this event, the transmission paths, which are extended from the third and fourth element electrodes 20c, 20d to the third and fourth external connection electrodes 30c, 30d via the wiring layers (not shown), are connected to the light receiving element for monitoring the lights emitted from the light emitting element. Therefore, it is not always needed to consider the characteristic impedance of the transmission paths of the light receiving element strictly.

Then, as depicted in FIGS. 5A and 5B, a metal sealing ring 40 is prepared. An outer shape of the metal sealing ring 40 is a circular shape, and a circular opening portion 40x provided in the center part. Then, a ring-like protruding portion 42 protruded upward is formed on the outer peripheral part of the opening portion 40x.

The metal sealing ring 40 is formed of Kovar (an iron (Fe)-nickel (Ni)-cobalt (Co) alloy), for example. Then, as depicted in FIG. 5A, the metal sealing ring 40 is joined onto the ceramic wiring substrate portion 5 in FIG. 3 by the metal brazing material. As the metal brazing material preferably a silver solder (Ag—Cu (28%) alloy) is used.

At this time, the opening portions 22x shaped like the half circle are formed on the upper ground plane 22 of the ceramic wiring substrate portion 5 to oppose to each other. Because the opening portions 22x function as the groove, such a situation can be prevented that the metal brazing material flows into the inner area of the ceramic wiring substrate portion 5.

By this matter, as depicted in FIG. 5A, an optical semiconductor element package 2 according to the embodiment is obtained. As depicted in FIG. 5A, the optical semiconductor element package 2 of the present embodiment includes the ceramic wiring substrate portion 5 in FIG. 3, and the metal sealing ring 40 provided thereon.

The metal sealing ring 40 has the opening portion 40x, which causes the first to fourth element electrodes 20a to 20d and the mounting area A of the ceramic wiring substrate portion 5 to expose, in the center part thereof. Also, the ring-like protruding portion 42 is provided on the outer peripheral part of the opening portion 40x. The outer periphery of the metal sealing ring 40 is arranged to protrude outward beyond the outer periphery of the ceramic wiring substrate portion 5.

Then, as depicted in FIGS. 6A and 6B, a surface emitting laser 50 (a light emitting element) is mounted on the first cavity C1 of the ceramic wiring substrate portion 5 via a submount 52 to direct its light emitting surface upward. The surface emitting laser 50 is called VCSEL (Vertical Cavity Surface Emitting Laser).

At this time, heights of the electrodes of the surface emitting laser 50 are set identically to heights of the first and second element electrodes 20a, 20b by adjusting a height of the submount 52, or the like.

Also, a light receiving element 60 is mounted on the second cavity C2 of the ceramic wiring substrate portion 5 via a submount 62 to direct its light receiving portion 60a upward. As the light receiving element 60, preferably a photodiode should be employed. Also upon mounting the light receiving element 60, heights of the electrodes of the light receiving element 60 are set identically to heights of the third and fourth element electrodes 20c, 20d by adjusting a height of the submount 62, or the like.

In the case that respective back surfaces of the surface emitting laser 50 and the light receiving element 60 are connected electrically to the upper ground plane 22a on the bottom part of the cavity C, respective submounts 52, 62 are formed of the conductive material.

Then, as depicted similarly in FIGS. 6A and 6B, the electrodes of the surface emitting laser 50 and each of the electrodes 20a, 20b are connected mutually via a gold wire 44 respectively by the wire bonding method. In addition to the gold wire 44, various metal wires such as a copper wire, and the like can be used.

As described above, the ceramic wiring substrate portion 5 is manufactured based on the green sheet method. Therefore, the distances between the electrodes of the surface emitting laser 50 and each of the electrodes 20a, 20b can be set to about 0.5 to 0.7 mm respectively. As a result, the length of the gold wires 44 can be set shorter than that in the case that the header 100 in the preliminary matter is used.

Further, in the ceramic wiring substrate portion 5 according to the present embodiment, the length of the gold wires 44 can also be shortened from such an aspect that the electrodes of the surface emitting laser 50 and the first and second element electrodes 20a, 20b can be set in the identical height respectively.

In the header 100 in the preliminary matter, the height of the electrodes of the surface emitting laser 200 and the height of the first and second leads 100a, 100b are different from each other. Therefore, the length of the gold wires 160 is further lengthened correspondingly.

Subsequently, the electrodes of the light receiving element 60 and each of the electrodes 20c, 20d are connected mutually via the gold wire 44 by the wire bonding method respectively.

Then, as depicted in FIG. 7, a metal cap 70 is prepared. The metal cap 70 is formed of Kovar (the iron (Fe)-nickel (Ni)-cobalt (Co) alloy), for example.

The metal cap 70 includes a cylinder portion 70a, a ring-like joining portion 70b connected to a lower part of the cylinder portion 70a, and a ceiling portion 70c for covering an upper part of the cylinder portion 70a and having a circular transparent glass window 72 in its center part. The ceiling portion 70c of the metal cap 70 is provided to incline at a predetermined angle to the horizontal direction. The glass window 72 is arranged to incline in parallel with the ceiling portion 70c.

Then, the metal cap 70 is joined onto the metal sealing ring 40 of the optical semiconductor element package 2 in FIG. 6A by the resistance welding. Here, an inner diameter of the cylinder portion 70a of the metal cap 70 corresponds to an outer diameter of the ring-like protruding portion 42 of the metal sealing ring 40.

Therefore, by arranging the metal cap 70 on the metal sealing ring 40 such that the inner peripheral surface of the cylinder portion 70a touches the outer peripheral surface of the ring-like protruding portion 42, the metal cap 70 can be easily aligned with the metal sealing ring 40. As a result, the light emitting portion of the surface emitting laser 50 is arranged to be aligned with the center part of the circular glass window 72 of the metal cap 70.

In this way, the metal cap 70 is fitted onto the ceramic wiring substrate portion 5 via the metal sealing ring 40. Because the metal sealing ring 40 is employed, not only the metal can 70 can be joined to the metal sealing ring 40 by the resistance welding, but also the metal can 70 can be arranged to be aligned easily with the surface emitting laser 50.

Accordingly, as depicted in FIG. 7, an optical semiconductor device 1 according to the embodiment is obtained. As depicted in FIG. 7, the optical semiconductor device 1 of the embodiment includes the ceramic wiring substrate portion 5 in FIG. 5A, and the surface emitting laser 50 and the light receiving element 60 are mounted on the mounting area A in the cavity C.

Further, the optical semiconductor device 1 of the embodiment includes the gold wires 44 for connecting the electrodes of the surface emitting laser 50 and the light receiving element 60, and the first to fourth element electrodes 20a to 20d, and the metal cap 70 provided on the metal sealing ring 40 to have the glass window 72 on its center part. The surface emitting laser 50 and the light receiving element 60 are hermetically sealed with the metal cap 70.

Figure 8:
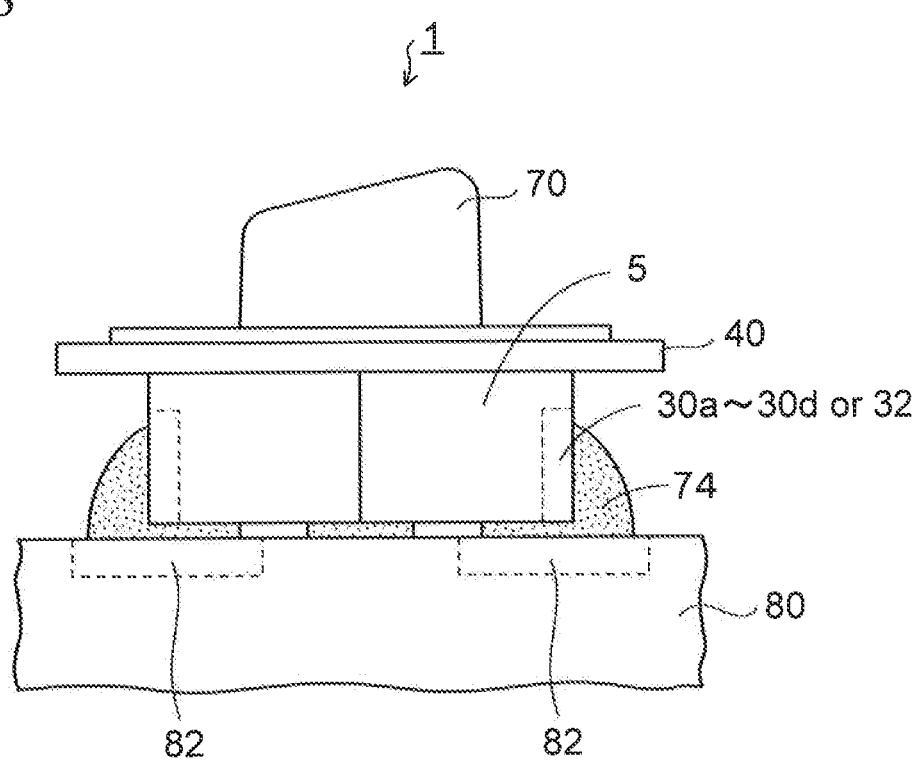
FIG. 8 is a schematic side view depicting a state that the optical semiconductor device in FIG. 7 is mounted on a mounting substrate.

As depicted in a schematic side view of FIG. 8, the optical semiconductor device 1 of the embodiment is mounted on a mounting substrate 80 concerning with the optical fiber device. At this time, a conductive joining material 74 made of solder, or the like is formed to the side of the first to fourth external connection electrodes 30a to 30d and the ground connection electrode 32, all of which are formed on the sidewalls of the ceramic wiring substrate portion 5, and these electrodes 30a to 30d, 32 are connected electrically to connection portions 82 of the mounting substrate 80 respectively. Also, electrodes provided on the lower surface of the ceramic wiring substrate portion 5 are connected to the mounting substrate 80 via the conductive joining materials 74 respectively.

By doing the above, it can be confirmed by checking the conductive joining materials 74 formed on the side surfaces with the eyes whether or not the first to fourth external connection electrodes 30a to 30d and the ground connection electrode 32 of the ceramic wiring substrate portion 5 have been connected to the connection portions 82 of the mounting substrate 80 respectively.

In the optical semiconductor device 1, the electric signals are supplied from the first and second external connection electrodes 30a, 30b to the surface emitting laser 50 via the wiring layers and the first and second element electrodes 20a, 20b. By this matter, the lights are emitted upward from the light emitting portion of the surface emitting laser 50. The lights emitted from the surface emitting laser 50 are transmitted through the glass window 72 of the metal cap 70, and are transferred to the optical fiber provided on the outside.

At this time, a part of the lights emitted from the surface emitting laser 50 is reflected by the inclined glass window 72, and is entered into the light receiving portion 60a of the light receiving element 60. In this manner, the lights emitted from the surface emitting laser 50 are monitored by the light receiving element 60.

In the optical semiconductor device 1 of the embodiment, by employing the ceramic wiring substrate portion 5 as described above, the distances between the surface emitting laser 50 and the first and second element electrodes 20a, 20b can be made shorter than those in the case that the header in the preliminary matter is employed.

Accordingly, the lengths of the gold wires 44 used to connect the surface emitting laser 50 and the first and second element electrodes 20a, 20b can be shortened. Further, the characteristic impedance of the transmission paths can be set easily to 50Ω by forming the ground planes, the element electrodes, the wiring layers, etc. in the ceramics serving as the dielectrics, or the like. As a result, this optical semiconductor device 1 can respond to the higher-speed transmission of the electric signals, and can respond to the application of the large capacity optical communication of 10 Gbps or more.

Also, by employing the ceramic wiring substrate portion 5, respective external connection electrodes provided on the inner parts of the wiring substrate portion can be connected to the mounting substrate used for the surface mounting. By this matter, there is no necessity to use the lead whose diameter is fine and whose handling is bad. As a result, the productivity in manufacturing the ceramic wiring substrate portion 5 and in mounting the optical semiconductor device 1 can be improved.

Also, the metal sealing ring 40 and the metal cap 70 on the ceramic wiring substrate portion 5 are formed like a circular shape. Therefore, facility of the optical coupling to the optical fiber device that is constructed in the circular shape can be still maintained.

In the embodiment, such a node is illustrated that the light emitting device is obtained by mounting the surface emitting laser 50 and the light receiving element 60 monitoring the light emitted from this laser, as the optical semiconductor elements, on the optical semiconductor element package.

As another mode, the light receiving device may be obtained by mounting the light receiving element, which receives the light being entered from the outside (optical fiber) and converts the light into the electric signal, on the optical semiconductor element package.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

What is claimed is:

1. An optical semiconductor element package, comprising:
    a ceramic wiring substrate having a mounting area for mounting an optical semiconductor element, in a center part;
    an element electrode for connecting the optical semiconductor element, the element electrode provided on the ceramic wiring substrate;
    an external connection electrode electrically connected to the element electrode, the external connection electrode provided to the ceramic wiring substrate;
    an upper ground plane provided on an upper face of the ceramic wiring substrate;
    first opening portions formed in the upper ground plane, the first opening portions being at least a first groove and a second groove each shaped like a substantially continuous half-circle and opposed to each other, in a planar view, wherein the grooves prevent brazing material from flowing into an inner area of the ceramic wiring substrate;
    a lower ground plane provided on a lower face of the ceramic wiring substrate; and
    a metal sealing ring provided on the ceramic wiring substrate, and including a second opening portion exposing the element electrode and the mounting area, in a center part, and a ring-like protruding portion provided to an outer peripheral part of the second opening portion,
    wherein an outer shape of the metal sealing ring is larger than an outer shape of the ceramic wiring substrate,
    wherein an outer shape of the ceramic wiring substrate has a hexagonal shape or an octagonal shape.

2. An optical semiconductor element package according to claim 1, wherein a concave portion shaped like a half circular column is provided on a sidewall constituting an outer periphery face of the ceramic wiring substrate from a lower end to an upper side, and the external connection electrode is provided on an inner surface of the concave portion.

3. An optical semiconductor element package according to claim 1, wherein a cavity is provided in the mounting area of the ceramic wiring substrate, and the optical semiconductor element is mounted on a bottom part of the cavity via a submount.

4. An optical semiconductor element package according to claim 1, wherein the element electrode is connected to the external connection electrode via a wiring layer which is formed in an inner part of the ceramic wiring substrate.

5. An optical semiconductor device, comprising:
    the optical semiconductor element package set forth in claim 1;
    the optical semiconductor element mounted in the mounting area;
    a metal wire connecting an electrode of the optical semiconductor element and the element electrode; and
    a metal cap provided on the metal sealing ring, and hermetically sealing the optical semiconductor element, and having a glass window in a center part.

6. An optical semiconductor device according to claim 5, wherein a cavity is provided in the mounting area of the ceramic wiring substrate, and the optical semiconductor element is mounted on a bottom part of the cavity via a submount, and
    a height of the electrode of the optical semiconductor element is set to an identical height with the element electrode.

7. An optical semiconductor device according to claim 5, wherein the opening portion of the metal sealing ring and the metal cap have a circular shape, and an inner diameter of the metal cap corresponds to an outer diameter of the ring-like protruding portion of the metal sealing ring.

8. An optical semiconductor device according to claim 5, wherein a concave portion is provided on a sidewall of the ceramic wiring substrate from a lower end to an upper side, and the external connection electrode is provided on an inner surface of the concave portion, and
    when the optical semiconductor device is mounted on a mounting substrate, a conductive joining material is provided on a side of the external connection electrode, and the optical semiconductor device is connected electrically to the mounting substrate.

9. An optical semiconductor device according to claim 5, wherein the optical semiconductor element is a surface emitting laser and a light receiving element monitoring a light emitted from the surface emitting laser, or a light receiving element receiving a light which is entered from an outside.

10. An optical semiconductor element package according to claim 1, wherein a concave portion shaped like a half circular column is provided on a sidewall constituting an outer periphery face of the ceramic wiring substrate from a lower end to an upper side, and a ground connection electrode electrically connected to the upper ground plane and the lower ground plane is provided on an inner surface of the concave portion.

* * * * *